LOW OUTPUT IMPEDANCE MAJORITY LOGIC INVERTING CIRCUIT

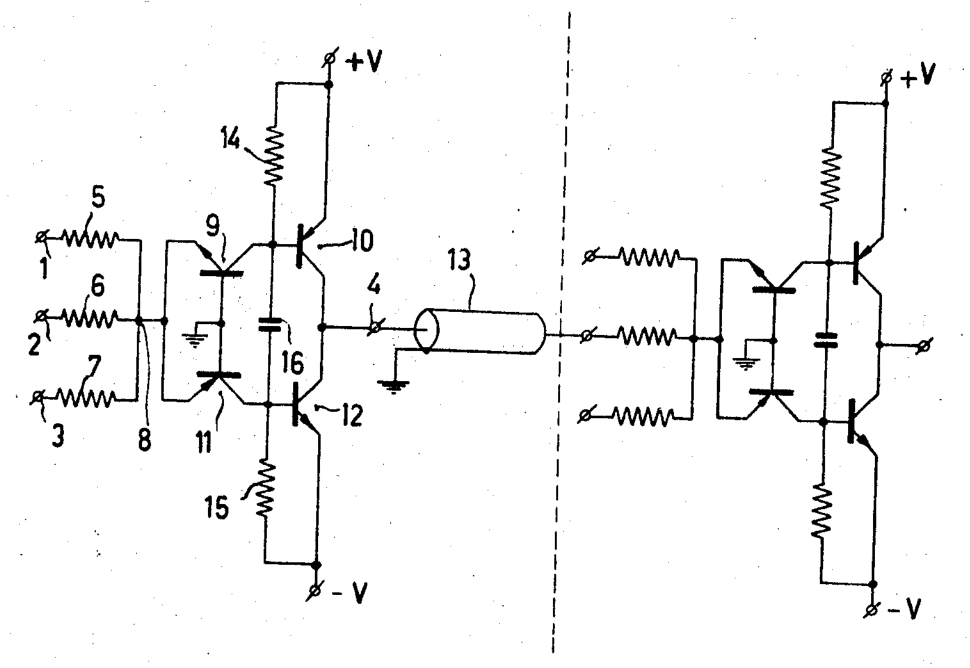
INVENTORS
WILLEM BONGENAAR
JOANNES PAULUS MARIA GIELES
ARIE SLOB
BY
AGENT 3,433,978

Willem Bongenaar, Joannes Paulus Maria Gieles, and Arie Slob, Emmasingel, Eindhoven, Netherlands, assignors to North American Philips Company, Inc., New York, N.Y., a corporation of Delaware Filed Apr. 1, 1965, Ser. No. 444,633
Claims priority, application Netherlands, Apr. 11, 1964, 6403951
U.S. Cl. 307—214 3 Claims
Int. Cl. H03k *19/40, 17/60, 19/42*

ABSTRACT OF THE DISCLOSURE

A majority logic inverting circuit employing pairs of symmetric transistor paths of complementary transistor types for providing a two level output signal having low output impedance conditions in either level.

This invention relates to inverting circuits comprising an input circuit having one or more signal inputs and a signal output. The input circuit is controlled by logical input signals of two different voltage levels, and the output stage is transistorized controlled by the logical output signal from the input circuit.

Such inverting circuits are used inter alia in logical circuits of electronic computers in which the distances between the logical circuits may be such that it is necessary to use transmission lines for the transmission of logical signals, the lines having comparatively low characteristic impedances.

An object of the invention is to provide an inverting circuit which is very suitable for feeding one or more transmission lines connected in parallel thereto, and also, because of its high insensitivity to interference, is usable in an ambience having a high interference level.

An inverting circuit according to the invention is characterized in that the output stage is constituted by two switching transistors of opposite conductivity types. The emitter-collector paths of the transistors each fulfil the function of a switch between a point of constant potential connected to the emiter and a common load connected to both collectors. In order to control the two switching transistors, each switching transistor has associated with it a control transistor of opposite conductivity type in common base connection the collector of which is connected to the base of the associated switching transistor, the control transistors being controlled by the logical input signals.

In order that the invention may be readily carried into effect, it will now be described in detail, by way of example, with reference to the accompanying diagrammatic drawing.

For illustrative purposes the figure shows a logical circuit which controls an input of an identical logical circuit. Since the two logical circuits are identical, it suffices to give one description for both logical circuits and, to this end, only one logical circuit is provided with reference numerals for the sake of simplicity. Each of the logical circuits shown has three input terminals 1, 2, 3, and an output terminal 4. Logical input signals are applied to the input terminals 1, 2 and 3, a logical output signal being derived from the output terminal 4. The logical signals have two voltage levels which are respectively positive and negative to ground and to which the values 1 and 0 may be assigned. The logical function of the logical circuits shown is a majority function of the logical input signals.

The input terminals 1, 2 and 3 are connected through identical resistors 5, 6 and 7 respectively to a common point 8. The logical signal appearing at this point is fed through an npn-type transistor 9 to the base of a pnp-type switching transistor 10, which fulfils the function of a switch, while also being fed through a pnp-type transistor 11 to the base of an npn-type transistor 12, which also fulfils the function of a switch. The transistors 9 and 11 are each in common base connection and the switching transistors 10 and 12 are each in common emitter connection. The logical signal applied to the base of a switching transistor is active at one of the values of the signal so that the switching transistor is saturated and is active at its other value so that the switching transistor is cut off. The logical signals are applied with equal phase to the bases of the two switching transistors which are of opposite conductivity types so that they are controlled in opposite directions. The logical circuit is designed so that the switching transistor 12 is saturated at the positive voltage value of the logical signal appearing at the common point 8 and the switching transistor 10 is saturated at the negative voltage value. A switching transistor amplifies and invert the logical signal applied to its base, passing it on to the output terminal 4 which is connected in common to the collectors of the two switching transistors. A saturated output transistor constitutes a very low output impedance between the emitter and the collector and a non-conducting switching transistor constitutes a very high impedance between the said electrodes. The emitter of the switching transistor 10 is directly connected to a positive point of supply of +V volts and the emitter of the switching transistor 12 is directly connected to a negative point of supply of —V volts so that the two levels of the logical output signal appearing at the output terminal 4 are substantially equal to +V volts and —V volts respectively. It is to be noted that the output impedance of the logical circuit is very low for both values of the input signal so that the logical circuit can convey a high load current in either direction. The logical output signal is applied to an input terminal or one or more subsequent logical circuits such as shown in the drawing for one subsequent logical circuit. The distance from the following logical circuit may be large so that even within a computer, it may be desirable for use in the transmission of logical signals in a transmission line, for example, a coaxial cable as shown at 13. If a plurality of logical circuits are controlled by a logical circuit, each of which may be fed through a separate cable, which cables are connected in parallel to the common output terminal 4.

The logical input signals applied to the input terminals 1, 2 and 3 are derived from exactly identical logical circuits and thus have a level of +V volts or —V volts. If two or more of the input terminals have a voltage of +V volts the common point has a positive voltage, and if two or more of the input terminals have a voltage of —V volts the common point has a negative voltage. The polarity of the voltage on the common point 8 thus is an indication of whether the majority of the logical input signals have the positive or the negative voltage value.

The mean level of the logical signals at the common point 8 is at zero potential, while the control of the switching transistors 10 and 12 require control signals having a mean level which is positive or negative with respect to ground. The mean level of the logical signal at the common point 8 is displaced to a positive or negative mean level in an advantageous manner by means of the control transistors 9 and 11 of opposite conductivity types. The emitter-collector circuits of the control transistors 9 and 11 are connected between the common point 8 and the bases of the switching transistors 10 and 12, and each substitute for a conventional resistance. The bases of the two control transistors are connected to ground and thus have a potential which lies midway between the two levels of the logical signals. If the majority of the logical input signals have the positive voltage value, the transistor 11 is conducting and conveys an emitter current, while the emitter-base diode of transistor 9 is cut off by the voltage drop across the emitter-base diode of transistor 11. The common point 8 thus has a voltage which is slightly positive with respect to ground. The emitter current of transistor 11 is minimum if the voltage of two input terminals is positive and is maximum if the voltage of all three input terminals is positive. The minimum value of the emitter current is adjusted so that the collector current of transistor 11 drives the switching transistor 12 into the state of saturation. Transistor 9 is cut off and constitutes a high impedance between the collector and the emitter or the base so that the switching transistor 10 is driven into the non-conducting state. To prevent excessive leakage currents in the cut off position of a switching transistor, the bases of the switching transistors are connected to the emitters through resistors 14 and 15 respectively. If the majority of the logical input signals have the negative voltage value, then transistor 9 conveys a collector current which drives the switching transistor 10 into the state of saturation, the switching transistor 12 being cut off by the transistor 11 which is non-conducting. The common point 8 thus has a voltage which is slightly negative with respect to earth. If the voltage at the common point 8 with respect to earth changes its polarity a transistent phenomenon occurs in the logical circuit between the static condition of the circuit prior to the change of polarity and the static condition thereof after the change of polarity. During such a change of polarity whereby the positive voltage of the common point 8 changes to a negative voltage, the control current of switching transistor 12 is cut-off and the control current of switching transistor 10 is switched on. Transistor 12 still remains in the state of saturation for a short time after the control current is switched off. This state of saturation is characterized by an excess of minority charge carriers in the base zone and very small potential differences between the electrodes. By switching on its control current, switching transistor 10 comes into the state of saturation and constitutes a low-ohmic collector resistor for the switching transistor 12. Thus, the excess charge of the base zone of transistor 12 is rapidly dissipated through the collector. The direction of the base current of transistor 12 is then opposite to the direction preceding to switching off of the control current and this reverse base current flows through resistor 15 to the negative point of supply of —V volts. The reverse base current may be increased for speeding up the switching off of an output transistor by the use of capacitor 16 included between the bases of the transistors 10 and 12. This capacitor has a substantally constant voltage of 2V volts. During switching-on the control current of transistor 10 the voltage of its base decreases, while at the same time the base voltage of transistor 12 does not substantially vary due to this transistor still being saturated. Consequently a discharge current flows through the capacitor 16 and causes a reverse base current through transistor 12. After transistor 12 has become non-conducting the capacitor 16 is charged through resistor 15 to its original voltage.

The operation of the logical circuit upon a change of polarity in the reverse direction is quite analogous because of the symmetry in the construction of the logical circuit and needs therefore no further explanation.

In connection with the foregoing it may still be mentioned that a voltage sweep of the signal at the common point 8 between 0 volt and the value of the positive voltage is passed on by transistor 11 without attenuation to switching transistor 12 and a voltage sweep between 0 volt and the value of the negative voltage is passed on by transistor 9 without attenuation to switching transistor 10. Furthermore the switching transistors 10 and 12 are fed with a constant control current from the very high output resistances of the transistors 9 and 11 so that a high control power is available. This high control power is used upon switching-over to apply a high load current to the cables connected in parallel to the output terminal 4. During the change-over these cables each have a low input impedance which is equal to the characteristic impedance until the wave reflected at the other end appears at the input. The advantage of feeding the cables with a great current from a low output resistance is that the voltage across the output of the cable can vary rapidly and the logical signal appearing there exhibits steep edges. The load current provided by the logical circuit in the static condition is usually much smaller than is the case during a change of condition. From this, an excess saturation of the switching transistors result during the static condition, the circuit thus being insensitive to interference signals superimposed on the logical input signals.

What is claimed is:

1. An inverting circuit compirsing an input circuit having one or more signal inputs and a signal output, means applying a logical control signal of two different voltage levels to each of said signal inputs, a transistorized output stage controlled by the logical output signal from the input circuit, said output stage including two transistors of opposite conductivity types, the emitter-collector paths of which each fulfill the function of a switch, said emitter-collector paths having a point of constant potential connected to each emitter and a common load connected to both collectors, and a control circuit for the two switching transistors, said control circuit including a first and second control transistor of opposite conductivity type each in common base connection with the collector of each connected to the base of the associated switching transistor, the control transistors being controlled by the logical input circuits.

2. A majority logic inverting circuit comprising a plurality of commonly terminated inputs, means applying a logical control signal of one of two different voltage levels to each of said inputs, an output stage for providing low output impedance in both switched conditions of said circuit, said output stage comprising a pair of opposite conductivity type switching transistors, each of said output stage transistors including base, emitter and collector electrodes, means connecting a point of constant potential to the emitter electrode of each of said output stage transistors, means connecting a common load to both collector electrodes, capacitive means interconnecting the base electrodes of said output stage transistors, interstage means connecting the base electrodes of said output stage transistors to the common terminating point of said inputs, said interstage means including first and second interstage transistors of opposite conductivity types each having emitter, base and collector electrodes, said interstage transistor collector electrodes respectively connected to the base electrodes of each respective output stage transistor, said interstage transistor emitter electrodes commonly connected to said common terminating point, and the base electrodes of said interstage transistors commonly connected together to a ground point.

3. The combination of claim 2 further including a pair of leakage resistances each respectively connected between the base and emitter electrodes of each of said output stage transistors.

References Cited

UNITED STATES PATENTS

| | | | |
|---|---|---|---|
| 3,324,455 | 6/1967 | Mayer | 307—211 |
| 3,083,303 | 3/1963 | Knowles et al. | 307—288 X |
| 3,238,389 | 3/1966 | Marpe | 307—255 X |
| 3,319,175 | 5/1967 | Dryden | 307—313 X |

ARTHUR GAUSS, *Primary Examiner.*

R. H. PLOTKIN, *Assistant Examiner.*

U.S. Cl. X.R.

307—211, 255, 288, 313